US008612362B2

(12) United States Patent
Kumazawa et al.

(10) Patent No.: US 8,612,362 B2
(45) Date of Patent: Dec. 17, 2013

(54) APPLIANCE COOPERATION OPERATION DEVICE

(75) Inventors: Toshimitsu Kumazawa, Kawasaki (JP); Kazuto Kubota, Kawasaki (JP); Yuzo Tamada, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 120 days.

(21) Appl. No.: 13/233,353

(22) Filed: Sep. 15, 2011

(65) Prior Publication Data

US 2012/0078818 A1 Mar. 29, 2012

(30) Foreign Application Priority Data

Sep. 24, 2010 (JP) ................................ 2010-213417

(51) Int. Cl.

| | |
|---|---|
| ***G01R 11/56*** | (2006.01) |
| ***G01R 21/133*** | (2006.01) |
| ***G06F 17/00*** | (2006.01) |
| *G06Q 10/00* | (2012.01) |
| *G06Q 30/00* | (2012.01) |

(52) U.S. Cl.

USPC .......................................... 705/412; 705/7.35

(58) Field of Classification Search

USPC ......................... 705/1.1, 400–412, 7.11–7.35

See application file for complete search history.

(56) References Cited

U.S. PATENT DOCUMENTS

2008/0114499 A1 * 5/2008 Hakim et al. ................. 700/291

FOREIGN PATENT DOCUMENTS

| | | | |
|---|---|---|---|
| JP | 2004-159414 | 6/2004 | |
| JP | 2008-29104 | 2/2008 | |
| JP | 2009-21088 | 1/2009 | |
| JP | 2009-183086 | 8/2009 | |
| JP | 2010-97589 | 4/2010 | |
| JP | 2010-205255 | 9/2010 | |
| WO | WO2004057288 A1 * | 7/2004 | ............ G01K 17/00 |

OTHER PUBLICATIONS

U.S. Appl. No. 13/233,248, filed Sep. 15, 2011, Yonezawa, et al.

Office Action issued Jul. 3, 2012, in Japanese patent Application No. 2010-213417 (with English-language translation).

* cited by examiner

*Primary Examiner* — George Chen

(74) *Attorney, Agent, or Firm* — Oblon, Spivak, McClelland, Maier & Neustadt, L.L.P.

(57) ABSTRACT

An appliance cooperation operation device in which a facility database stores an introduction cost of a power storage shared among a plurality of customers, and a rated life of the power storage; a facility deteriorating influence calculator calculates deteriorating influence on the power storage by using at least one parameter selected from a discharge rate of the power storage in a first period, depth of discharge at the end of the first period, and environmental temperature in the first period; a customer electric energy collector collects, from each of the customers, data of electric energy consumption in the first period; and a customer's burden cost calculator calculates a burden cost of each customer in the first period by multiplying: a ratio of energy consumption of each customer to total customer energy consumption; the introduction cost; a ratio of the first period to the rated life; and the deteriorating influence.

7 Claims, 6 Drawing Sheets

FACILITY DATABASE

| | INTRODUCTION COST (YEN) | RATED LIFE (h) | DETERIORATION ACCELERATION COEFFICIENT | |
|---|---|---|---|---|
| | | | DISCHARGE RATE x (C) | DEPTH OF DISCHARGE y (%) |
| POWER STORAGE | 900,000 | 52560 | 0.6*(x-0.3)+1 | 0.1(y-90)+1 |
| POWER GENERATOR | 3,000,000 | 219000 | - | - |

| | |
|---|---|
| OPERATIONAL COST (YEN/h) | 250 |

FIG. 3

ELECTRIC ENERGY DATABASE

| DATE | TIME | CUSTOMER ELECTRIC ENRGY (Wh) | POWER-STORAGE ELECTRIC ENERGY (Wh) | GENERATED ELECTRIC ENERGY (Wh) | SYSTEM ELECTRIC ENERGY (Wh) | POWER PRICE (YEN/kWh) |
|---|---|---|---|---|---|---|
| 20100315 | 1234 | 361 | 0 | 320 | 41 | 24 |
| 20100315 | 1235 | 365 | 0 | 319 | 46 | 24 |
| 20100315 | 1236 | 368 | 0 | 311 | 57 | 24 |
| 20100315 | 1237 | 370 | 0 | 316 | 54 | 24 |
| 20100315 | 1238 | 362 | 0 | 319 | 43 | 24 |
| 20100315 | 1239 | 365 | 0 | 319 | 46 | 24 |
| 20100315 | 1240 | 365 | 0 | 318 | 47 | 24 |
| 20100315 | 1241 | 366 | 0 | 318 | 48 | 24 |
| 20100315 | 1242 | 369 | 0 | 311 | 58 | 24 |
| 20100315 | 1243 | 367 | 0 | 314 | 53 | 24 |
| 20100315 | 1244 | 370 | 0 | 312 | 58 | 24 |
| 20100315 | 1245 | 364 | 0 | 320 | 44 | 25 |
| 20100315 | 1246 | 363 | 0 | 320 | 43 | 25 |
| 20100315 | 1247 | 261 | 50 | 311 | 0 | 25 |
| 20100315 | 1248 | 266 | 53 | 319 | 0 | 25 |
| 20100315 | 1249 | 262 | 55 | 317 | 0 | 25 |
| 20100315 | 1250 | 261 | 53 | 314 | 0 | 25 |
| 20100315 | 1251 | 261 | 52 | 313 | 0 | 25 |
| 20100315 | 1252 | 266 | 45 | 311 | 0 | 25 |
| 20100315 | 1253 | 261 | 52 | 313 | 0 | 25 |
| 20100315 | 1254 | 261 | 51 | 312 | 0 | 25 |
| 20100315 | 1255 | 266 | 47 | 313 | 0 | 25 |
| ⋮ | ⋮ | ⋮ | ⋮ | ⋮ | ⋮ | ⋮ |

FIG. 5

APPLIANCE COOPERATION OPERATION DEVICE

CROSS REFERENCE TO RELATED APPLICATIONS

This application is based upon and claims the benefit of priority from the prior Japanese Patent Application No. 2010-213417, filed on Sep. 24, 2010, the entire contents of which are incorporated herein by reference.

FIELD

An embodiment of the present invention relates to an appliance cooperation operation device for fairly assigning the cost burden of a power storage to each of a plurality of customers sharing the power storage, for example.

BACKGROUND

A report issued by IPCC (Intergovernmental Panel on Climate Change) in 2007 shows that it is highly reliable (9 out of 10 are correct) that global warming is caused by greenhouse gases emitted through human activities. At present, this report is most accepted across the world. Further, this report shows that it is essential to promptly make a greater effort, by which importance of struggling against the global warming has been socially recognized.

Under these circumstances, various countermeasures have been taken under the government initiative. One of the countermeasures is to encourage the use of power generated by natural energy such as wind power and sunlight. The natural energy cannot be stably supplied, and thus the stability of a power system connected to the natural energy is affected. Accordingly, a power storage (storage battery) is used as a buffer for stabilizing the unstable supply from the energy source.

It is assumed that an expensive appliance such as storage battery is introduced to be shared among a plurality of members. In most of conventional methods concerning a system for sharing a storage battery, efficient utilization of the storage battery is a main object, and it is not often that cost burden is focused on. In a system based on a conventional method, the cost burden of a storage battery to be shared is determined depending on the amount of used power and occupancy time of the appliance. However, when a plurality of members utilize and share a facility or an appliance suffering remarkable deterioration as in the storage battery, the facility cost is unfairly shared since deteriorating influence on the appliance is not considered depending on the utilization situation of each member.

BRIEF DESCRIPTION OF THE DRAWINGS

FIG. 3 is a diagram showing an example of a facility database.

FIG. 5 is a diagram showing an example of an electric energy database.

DETAILED DESCRIPTION

According to an aspect of embodiments, there is provided an appliance cooperation operation device, including: a facility database, a facility deteriorating influence calculator, a customer electric energy collector, a customer's burden cost calculator.

The facility database stores an introduction cost of a power storage shared among a plurality of customers, and a rated life of the power storage.

The facility deteriorating influence calculator calculates deteriorating influence on the power storage by using at least one parameter selected from: a discharge rate of the power storage in a first period; depth of discharge at the end of the first period; and environmental temperature in the first period.

The customer electric energy collector collects, from each of the customers, data of electric energy consumption in the first period.

The customer's burden cost calculator calculates a burden cost of each customer in the first period by multiplying: a first ratio being a ratio of the electric energy consumption of each customer to a total electric energy consumption of the customers; the introduction cost of the power storage; a second ratio being a ratio of the first period to the rated life; and the deteriorating influence.

Hereinafter, an embodiment of the present invention will be described with reference to the accompanying drawings.

Figure 1:
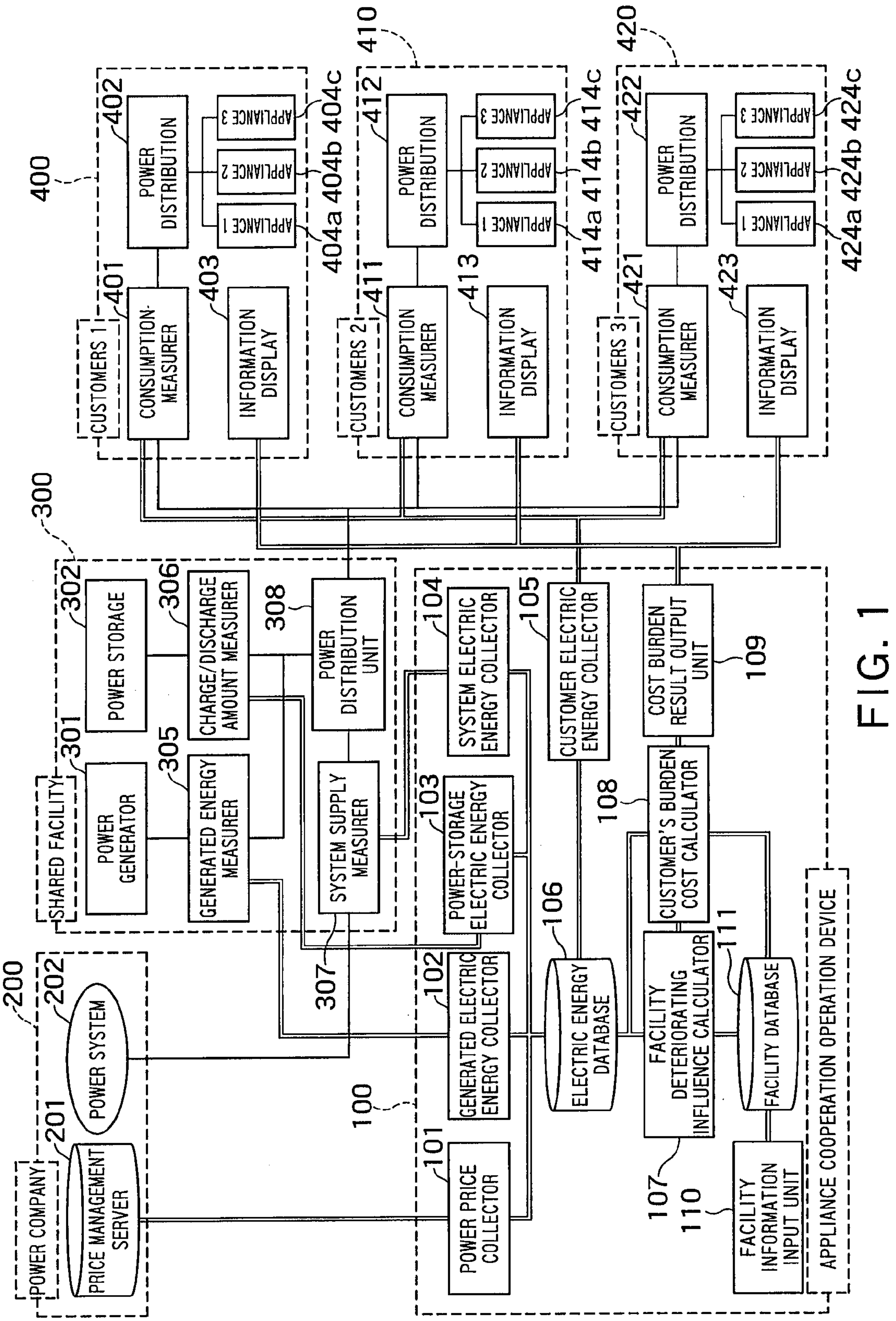
FIG. 1 is a block diagram showing the whole system including an appliance cooperation operation device according to the present embodiment.

FIG. 1 is a block diagram showing the whole system including an appliance cooperation operation device 100 according to the present embodiment.

This system includes: the appliance cooperation operation device 100; a power company 200; a shared facility 300; and N customers (members). N is an integer of 2 or greater. Here, only three customers, namely customers 1 to 3, are shown for simplification. In FIG. 1, each block is connected to each other through a power line shown by a thick line or through an information line shown by a double line.

The power company 200 includes a price management server 201 and a power system 202.

The power system 202 generates electric power by a plurality of power generating units using nuclear power, hydraulic power, thermal power, wind power, sunlight, geothermal power, etc., and supplies the generated power to the shared facility 300 through a power transmission line.

The price management server 201 controls the price of power supplied per unit time (power unit price).

Each of the customers 1 to 3 may be regarded as a customer's living place, a commercial building, or one of tenants in one commercial building.

In the customer 1, a plurality of appliances 404*a*, 404*b*, and 404*c* are connected to a power distribution unit 402. Each appliance operates with the power supplied from the power distribution unit 402. The appliances 404*a*, 404*b*, and 404*c* are power-consuming appliances such as lighting apparatus, air conditioner, television, etc. The power distribution unit 402 receives power supplied from the shared facility 300. A customer-side electric energy consumption measurer 401 measures electric energy consumption supplied from the shared facility 300 to the power distribution unit 402, and notifies the measured data to the appliance cooperation operation device 100 through an information line. Further, the customer 1 has an information display 403. The information display 403 may be formed as a browser screen of a personal computer or as a television. The information display 403 displays the data transmitted from the appliance cooperation operation device 100. The elements 401, 402, 403, 404*a*, 404*b*, 404*c* of the customer 1 form a customer system 400.

The customer 2 similarly has: a plurality of appliances 414*a*, 414*b*, and 414*c*; a power distribution unit 412; a customer-side electric energy consumption measurer 411; and an information display 413, which form a customer system 410. The customer 3 similarly has: a plurality of appliances 424*a*, 424*b*, and 424*c*; a power distribution unit 422; a customer-side electric energy consumption measurer 421; and an information display 423, which form a customer system 420.

The shared facility 300 has: a power generator 301; a power storage 302; a generated energy measurer 305; a power-storage charge/discharge amount measurer 306; a system electric energy supply measurer 307; and a power distribution unit 308.

The power generator 301 is a power generating unit for generating power using sunlight, wind power, etc. The generated power is transmitted to the power distribution unit 308. The power generator 301 is shared among a plurality of customers.

The power storage 302 is a chargeable/dischargeable storage battery such as lead storage battery, NAS storage battery, lithium-ion storage battery, etc. The power storage 302 is shared among a plurality of customers. The power storage 302 can supply power to the power distribution unit 308 by discharging the power charged thereto. Further, the power storage 302 can be charged with the power received from the power distribution unit 308.

The generated energy measurer 305 measures the power generation amount of the power generator 301, and notifies the measured data to the appliance cooperation operation device 100.

The power-storage charge/discharge amount measurer 306 measures the electric energy charged to and discharged from the power storage 302, and notifies the measured data to the appliance cooperation operation device 100. Further, the power-storage charge/discharge amount measurer 306 acquires parameters concerning the depth of discharge of the power storage 302, the discharge rate of the power storage 302, environmental temperature, etc., and notifies the acquired parameters to the appliance cooperation operation device 100. The power-storage charge/discharge amount measurer 306 periodically acquires these parameters (for example, each time when discharge operation is ended (when charge operation is started) in a charge/discharge cycle).

The system electric energy supply measurer 307 measures the electric energy supplied from the power system 202 to the power distribution unit 308. The system electric energy supply measurer 307 transmits the data of the measured electric energy to the appliance cooperation operation device 100.

The power distribution unit 308 distributes the power received from the power system 202, the power generator 301, and the power storage 302 to the customers 1 to 3 through the power line. Further, the power received from the power system 202 and the power generator 301 is partially charged to the power storage 302 by the power distribution unit 308.

The appliance cooperation operation device 100 has: a power price collector 101; a generated electric energy collector 102; a power-storage electric energy collector 103; a system electric energy collector 104; a customer electric energy collector 105; an electric energy database 106; a facility deteriorating influence calculator 107; a customer's burden cost calculator 108; a cost burden result output unit 109; a facility information input unit 110; and a facility database 111.

Figure 2:
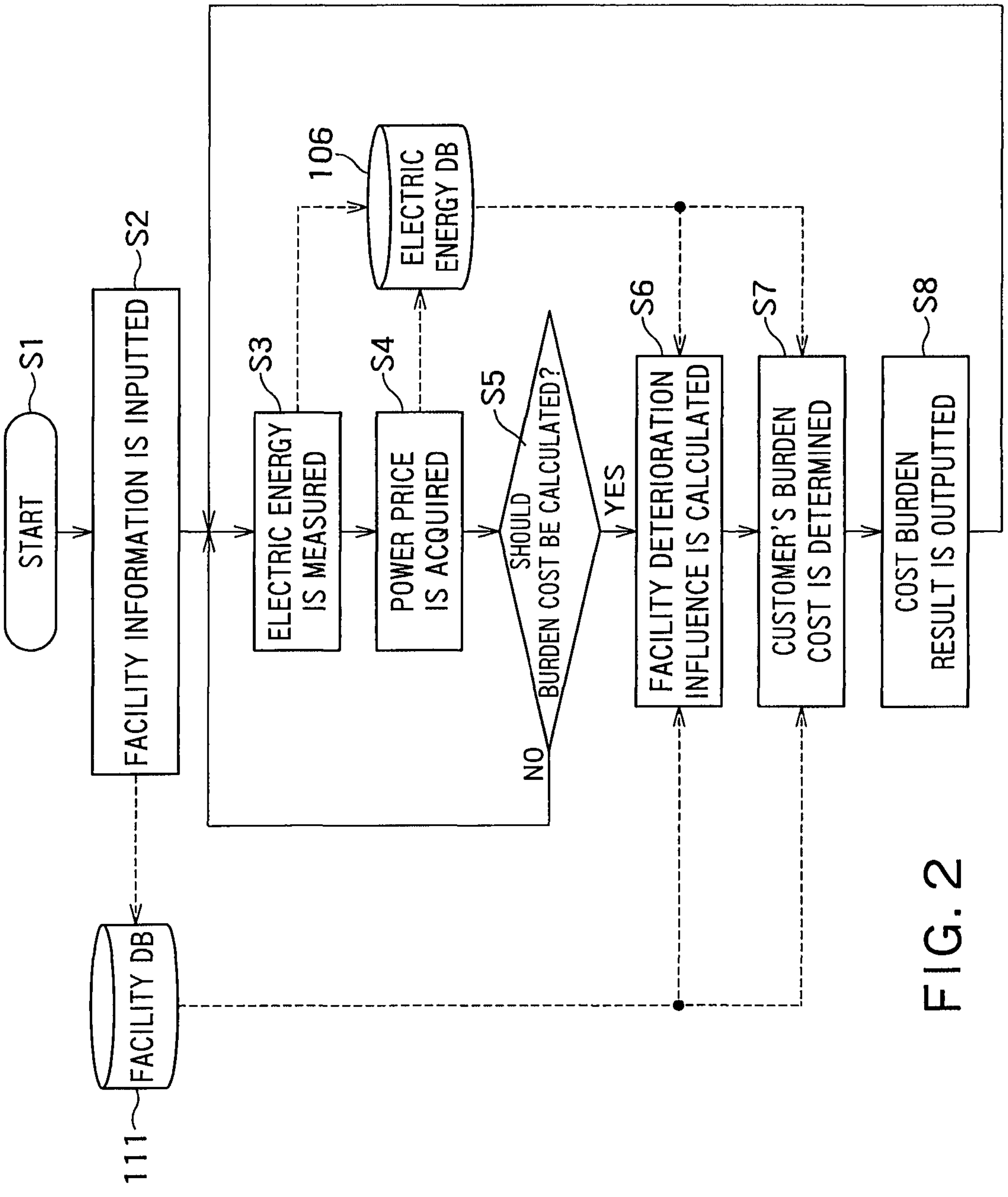
FIG. 2 is a flow chart showing the flow of the process performed by the appliance cooperation operation device.

Hereinafter, the structure and operation of each element of the appliance cooperation operation device 100 in FIG. 1 will be explained using FIG. 2. FIG. 2 is a flow chart showing the flow of the operation performed by the appliance cooperation operation device 100.

The process starts at step S1. Then at step S2 for "inputting facility information," the facility information input unit 110 of the appliance cooperation operation device is used to input; the introduction cost, rated life, and formula for calculating a deterioration acceleration coefficient of each of the power generator 301 and the power storage (storage battery) 302; and the operational cost of the appliance cooperation operation device 100, for example. The facility database 111 stores the information inputted by the facility information input unit 110. The introduction cost of the facility is obtained by adding an adjustment value reflecting various conditions to the cost for purchasing the facility.

FIG. 3 shows an example of the contents of the facility database 111.

The deterioration acceleration coefficient is a coefficient expressing how easily deterioration is accelerated compared to the case of rated operation, by using a parameter influencing on the lifetime of the facility. Parameters influencing on the lifetime of the power storage are discharge rate x, depth of discharge y, external temperature z, etc. The formula for calculating the deterioration acceleration coefficient is defined with respect to each parameter, respectively.

The deterioration acceleration coefficient has a reference value of 1, for example. As the value becomes larger than 1, the power storage deteriorates faster than the case of rated operation, and as the value becomes smaller than 1, the power storage deteriorates slower than the case of rated operation. For example, when the deterioration acceleration coefficient is 1.5, the power storage deteriorates 1.5 times faster than the case of rated operation. In other words, use frequency becomes 1/1.5 times lower compared to the case of rated operation.

In the example of FIG. 3, in order to calculate the deterioration acceleration coefficient, discharge rate x is used in a calculation formula of "$0.6*(x-0.3)+1$," and depth of discharge y is used in a calculation formula of "$0.1(y-90)+1$."

The deterioration acceleration coefficient calculated by the formula of $0.6*(x-0.3)+1$ is described as X, and the deterioration acceleration coefficient calculated by the calculation formula of $0.1(y-90)+1$ is described as Y.

Figure 4:
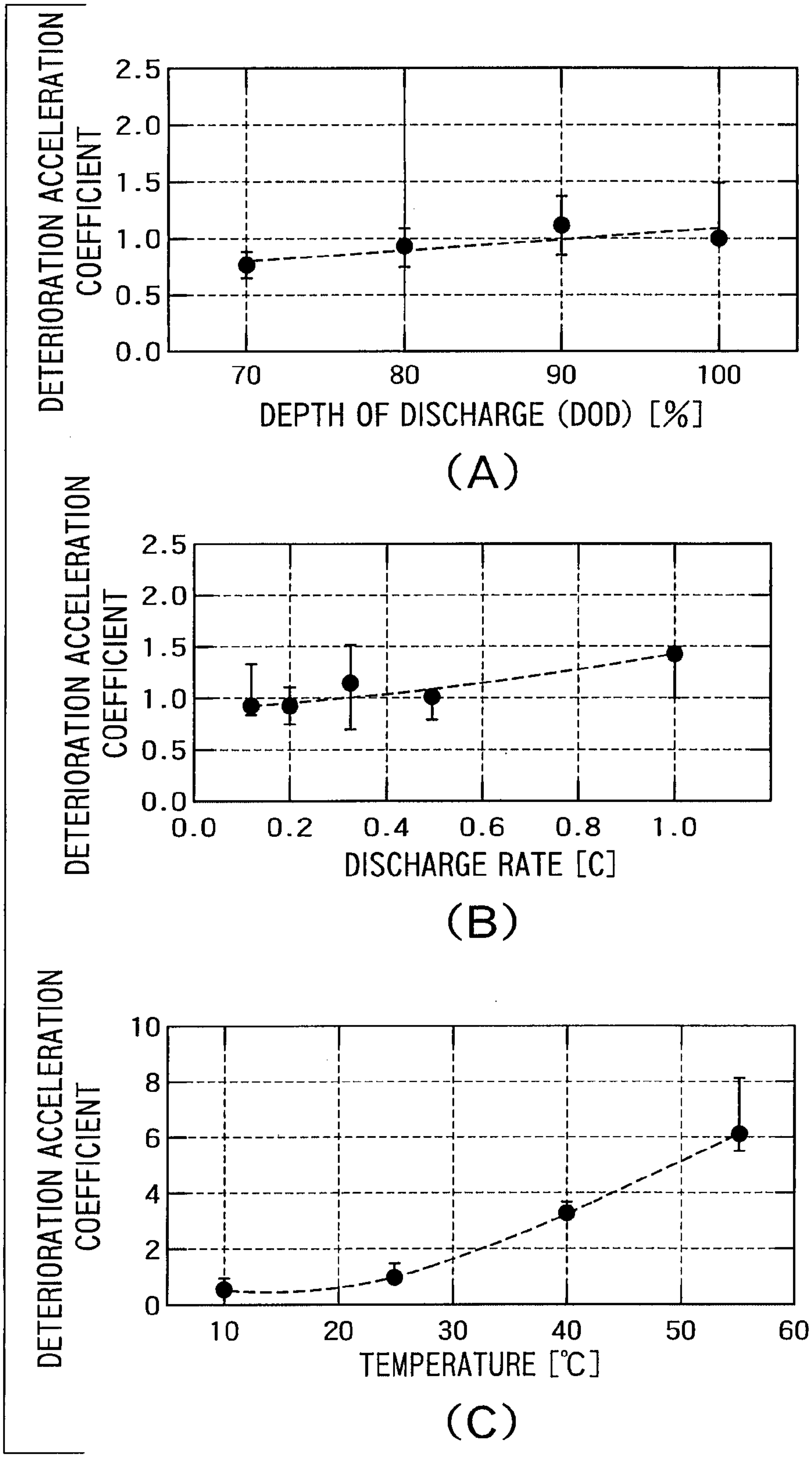
FIG. 4 is a diagram showing an example of cycle lifetime properties of a power storage.

These calculation formulas are obtained based on the cycle lifetime properties of the power storage to be used. FIG. 4 shows an example of cycle lifetime properties of the power storage.

FIG. 4(A) shows the relationship between the depth of discharge (DOD) of the power storage and the deterioration acceleration coefficient. The depth of discharge shows the discharge state of the power storage, and shows the percentage of discharge capacity (cell capacity) of the power storage. For example, when the depth of discharge is 70%, 70% of cell capacity is discharged with 30% of cell capacity being kept. As shown in the drawing, when the depth of discharge is 90% (when charging the cell while using 90% of cell capacity), the deterioration acceleration coefficient is 1 (based on the assumption that each of the other parameters satisfies the conditions for rated operation). The dotted-line graph in the drawing can be expressed as $0.1(y-90)+1$, which is equivalent to the above mathematical formula.

FIG. 4(B) shows the relationship between the discharge rate of the power storage 302 and the deterioration acceleration coefficient. The discharge rate shows the magnitude of current flowing when discharging the power storage 302, and the unit to be used is coulomb (C). When the discharge rate is 0.3, the deterioration acceleration coefficient is 1 (based on the assumption that each of the other parameters satisfies the conditions for rated operation). The dotted-line graph in the drawing can be expressed as 0.6*(x−0.3)+1, which is equivalent to the above mathematical formula.

FIG. 4(C) shows the relationship between the environmental temperature of the power storage 302 and the deterioration acceleration coefficient. When the environmental temperature is about 25° C., the deterioration acceleration coefficient is 1 (based on the assumption that each of the other parameters satisfies the conditions for rated operation). As the environmental temperature becomes higher than this value, the value of the deterioration acceleration coefficient becomes larger. It is also possible to obtain a formula for calculating the deterioration acceleration coefficient using the environmental temperature based on the dotted-line graph in the drawing, and this calculation formula may also be registered in the facility database of FIG. 3. The calculation formula may have a form of a lookup table relating the environmental temperature to the deterioration acceleration coefficient, in order to obtain a deterioration acceleration coefficient corresponding to a given environmental temperature. This applies similarly to the formula for calculating the deterioration acceleration coefficient in terms of the discharge rate or the depth of discharge.

At step S3 for "measuring electric energy" and step S4 for "acquiring power price," data is collected at constant time intervals (at 1-minute intervals, for example).

In more detail, at step S3 for "measuring electric energy," the customer electric energy collector 105 acquires the electric energy measured by the customer-side electric energy consumption measurers 401, 411, and 421 of the customers 1 to 3 during each constant time interval.

Further, the power-storage electric energy collector 103 acquires the data of electric energy (charge/discharge amount) measured by the power-storage charge/discharge amount measurer 306 in the shared facility 300 during each constant time interval.

Furthermore, the generated electric energy collector 102 acquires the data of electric energy (power generation amount) measured by the generated energy measurer 305 in the shared facility 300 during each constant time interval.

Still further, the system electric energy collector 104 acquires the data of electric energy measured by the system electric energy supply measurer 307 in the shared facility 300 during each constant time interval.

At step S4 for "acquiring power price," the power price collector 101 acquires, from the price management server 201 of the power company, the data of power price (power unit price) in each constant time interval.

The data acquired at steps S3 and S4 is stored in the electric energy database 106.

FIG. 5 shows an example of the contents of the electric energy database 106. In the example of FIG. 5, data is collected at 1-minute intervals.

At step S5 for "making judgment on calculating burden cost," the customer's burden cost calculator 108 judges whether or not to calculate the cost burden. In the present embodiment, the burden cost is calculated in each charge/discharge cycle period (first period) of the power storage, and the cost burden is calculated at the first moment when the power storage starts being charged after being discharged.

The charge/discharge cycle of the power storage 302 corresponds to a predetermined time period in the operating period (period of use) of the power storage 302, for example. For example, charge operation is performed in the nighttime, and discharge operation is performed in the daytime. Charge/discharge operation is performed until reaching a charge/discharge threshold value, or until the end of the corresponding time period. As another example of the charge/discharge cycle, it is also possible to start charge operation when the capacity of the power storage falls down to the discharge threshold value, and to perform the charge operation until the capacity reaches the charge threshold value.

The customer's burden cost calculator 108 recognizes the start of charge operation in the charge/discharge cycle by the notification from the shared facility 300, and determines to calculate the cost burden when receiving the notification. Further, the customer's burden cost calculator 108 may determine to calculate the cost burden at a predetermined hour. When the cost burden is determined not to be calculated, the process flow returns back to step S3. When the cost burden is determined to be calculated, the process flow proceeds to step S6 for "calculating facility deteriorating influence."

At step S6 for "calculating facility deteriorating influence," the facility deteriorating influence calculator 107 acquires parameter data concerning the depth of discharge and discharge rate of the power storage 302, from the shared facility 300 through the power-storage electric energy collector 103. The facility deteriorating influence calculator 107 calculates the facility deteriorating influence on the power storage 302 based on these parameters and the information of the facility database 111.

The facility deteriorating influence on the power storage is a numerical value representing how much deteriorating influence on rated life is caused by the operation of the power storage in a certain period (one charge cycle period) compared to the case of rated operation. The value obtained by multiplying the deterioration acceleration coefficients each being calculated on each parameter is equivalent to the facility deteriorating influence (mentioned later in detail).

Next, at step S7 for "determining the customer's cost burden," the customer's burden cost calculator 108 computes the cost (expense) to be burdened on each customer based on the facility deteriorating influence calculated by the facility deteriorating influence calculator 107, and the information of the electric energy database 106 and the facility database 111.

At step S8 for "outputting a cost burden result," the cost burden result output unit 109 notifies each user of each customer's cost burden value through their information displays 403, 413, and 423.

Figure 6:
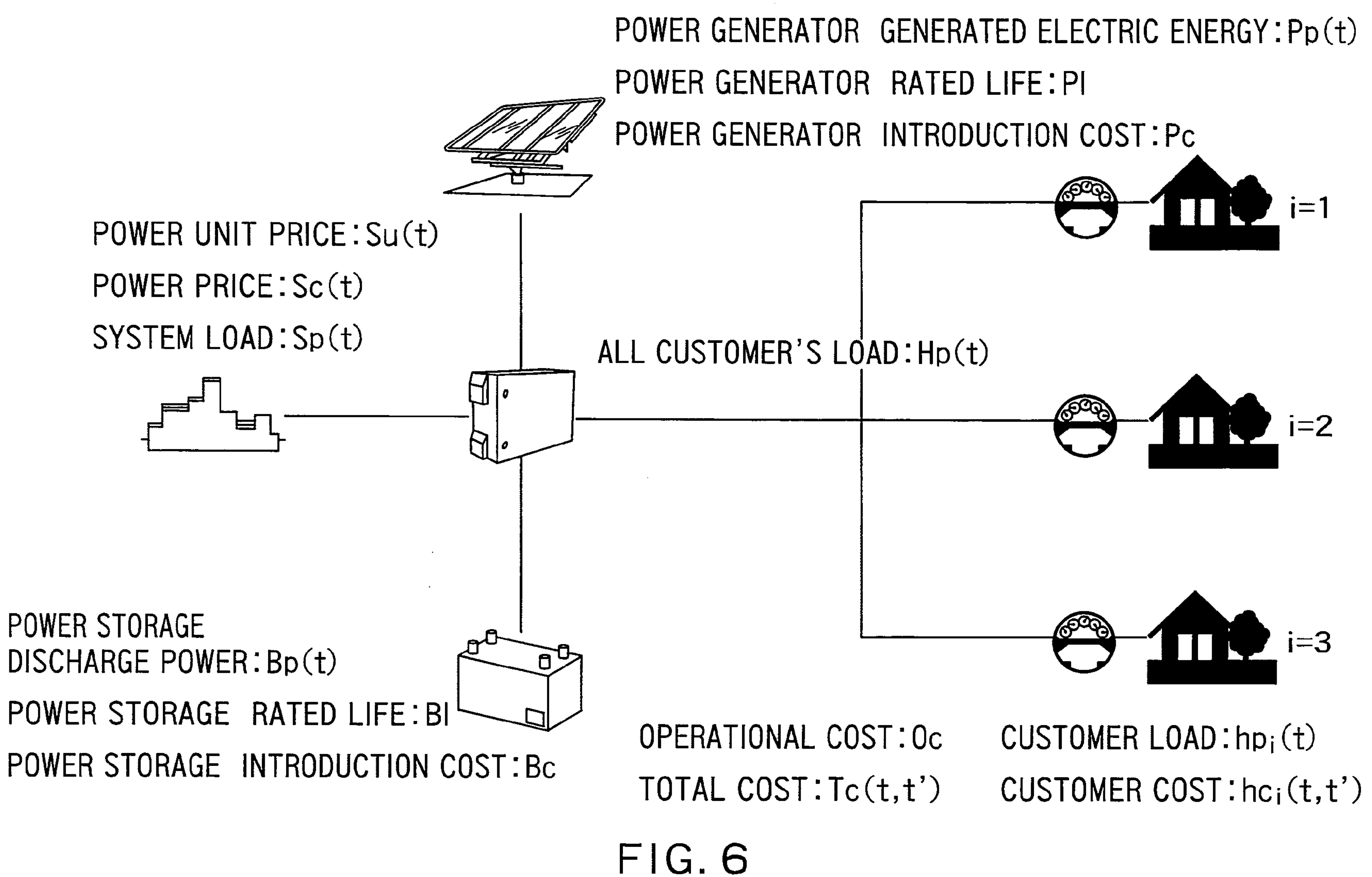
FIG. 6 is a diagram showing variables used in the present embodiment.

Hereinafter, steps S6 and S7 will be explained in detail. In steps S6 and S7, the facility deteriorating influence and the burden cost of each customer are calculated based on the following Formulas (1) to (8) using the variables defined in FIG. 6.

Power price Sc(t) at hour t can be expressed as in the following formula by using system load Sp(t) and power unit price Su(t).

$$Sc(t)=Sp(t)\times Su(t) \quad \text{Formula (1)}$$

The system load Sp(t) can be expressed as in the following formula by using all customers' load Hp(t), power generator's power generation amount Pp(t), and power storage's discharge amount Bp(t).

$$Sp(t)=Hp(t)-Pp(t)-Bp(t) \quad \text{Formula (2)}$$

Here, when assuming that the introduction cost of the facility is shared among customers by burdening a certain amount of money on each customer during the use period of the facility, total cost $Tc(t_0-\Delta t, t_0)$ for period Δt at the point of calculation hour $t_0$ can be computed by the following formula using power generator's introduction cost Pc, power generator's rated life Pl, power storage's introduction cost Bc, power storage's rated life Bl, and operational cost Oc.

$$Tc(t_0-\Delta t, t_0) = \sum_{t=t_0-N}^{t_0} Sc(t) + Pc\frac{\Delta t}{Pl} + Bc\frac{\Delta t}{Bl} + Oc\cdot\Delta t \quad \text{Formula (3)}$$

The period Δt is the charge/discharge cycle period of the power storage, and $t_0$ is the time when charge operation is started. In Formula (3), Δt/Bl corresponds to a second ratio. Δt/Pl corresponds to a third ratio.

The total cost $Tc(t_0-\Delta t, t_0)$ to be shared among customers can be expressed as in the following formula by defining that the burden cost of a customer i as $hc_i(t_0-\Delta t, t_0)$.

$$Tc(t_0-\Delta t, t_0) = \sum_i hc_i(t_0-\Delta t, t_0) \quad \text{Formula (4)}$$

When calculating the burden cost of each customer by the proportion of each customer's total load $hp_i(t)$ to the all customers' total load Hp(t) in order to establish the above formula, the following formula is established. In Formula (5), the term $(\Sigma hp_i(t)/\Sigma Hp(t))$, which is one of the two terms on the right-hand side, corresponds to a first ratio showing a ratio of the electric energy consumption of each customer to the total electric energy consumption of a plurality of customers.

$$hc_i(t_0-\Delta t, t_0) = Tc(t_0-\Delta t, t_0)\cdot\frac{\sum_{t=t_0-\Delta t}^{t_0} hp_i(t)}{\sum_{t=t_0-\Delta t}^{t_0} Hp(t)} \quad \text{Formula (5)}$$

Here, Formula (5) can be expressed as follows, based on Formula (3).

$$hc_i(t_0-\Delta t, t_0) = \left(\sum_{t=t_0-\Delta t}^{t_0} Sc(t) + Pc\frac{\Delta t}{Pl} + Oc\cdot\Delta t\right)\cdot\frac{\sum_{t=t_0-\Delta t}^{t_0} hp_i(t)}{\sum_{t=t_0-\Delta t}^{t_0} Hp(t)} + Bc\frac{\Delta t}{Bl}\cdot\frac{\sum_{t=t_0-\Delta t}^{t_0} hp_i(t)}{\sum_{t=t_0-\Delta t}^{t_0} Hp(t)} \quad \text{Formula (6)}$$

In the mathematical formula 6, the last term on the right-hand side means that the introduction cost of the power storage is shared in the proportion of each customer's total load $hp_i(t)$ to the all customers' total load Hp(t). In this term, no deterioration is considered. When considering the deteriorating influence of the discharge rate expressed as $$\frac{d}{dt}Bp(t)$$

and the depth of discharge expressed as ∫Bp(t) in a unit charge/discharge cycle Δt, the cost burden of the introduction cost of the power storage can be expressed as in the following formula. That is, the cost burden of the power storage on each customer i can be calculated by Formula (7).

$$Bc\frac{\Delta t}{Bl}\cdot\frac{\sum_{t=t_0-\Delta t}^{t_0} hp_i(t)}{\sum_{t=t_0-\Delta t}^{t_0} Hp(t)}\times f\left(\frac{d}{dt}Bp(t)\right)\times g\left(\int Bp(t)\right) \quad \text{Formula (7)}$$

The function f is a formula for computing the deterioration acceleration coefficient X using the discharge rate. The function g is a formula for computing the deterioration acceleration coefficient Y using the depth of discharge.

The function f corresponds to "0.6*(x−0.3)+1" in the facility database of FIG. 3, and the discharge rate dBp(t)/dt corresponds to x.

Further, the function g corresponds to "0.1*(y−90)+1" in the facility database of FIG. 3, and the depth of discharge ∫Bp(t) corresponds to y.

$$f\left(\frac{d}{dt}Bp(t)\right)\times g\left(\int Bp(t)\right)$$

in Formula (7) is the facility deteriorating influence computed at step S6 for "calculating facility deteriorating influence."

In the above example, discharge rate and depth of discharge are used when considering the deterioration of the power storage, but other factors such as outside air temperature also have deteriorating influence on the power storage. Accordingly, the deterioration acceleration coefficient Z concerning outside air temperature may be used to calculate the facility deteriorating influence, based on the calculation of XXYXZ. In this case, the calculation formula of the deterioration acceleration Z using the outside air temperature z as an argument is inputted by the facility information input unit 110 and registered in the facility database 111.

As stated above, at step S7 for "determining the customer's cost burden" in the present embodiment, the cost burden of each customer is finally computed based on the following formula.

$$hc_i(t_0-\Delta t, t_0) = \left(\sum_{t=t_0-\Delta t}^{t_0} Sc(t) + Pc\frac{\Delta t}{Pl} + Oc\cdot\Delta t\right)\cdot\frac{\sum_{t=t_0-\Delta t}^{t_0} hp_i(t)}{\sum_{t=t_0-\Delta t}^{t_0} Hp(t)} + Bc\frac{\Delta t}{Bl}\cdot\frac{\sum_{t=t_0-\Delta t}^{t_0} hp_i(t)}{\sum_{t=t_0-\Delta t}^{t_0} Hp(t)}\times f\left(\frac{d}{dt}Bp(t)\right)\times g\left(\int Bp(t)\right) \quad \text{Formula (8)}$$

In Formula (8), $\Sigma Sc(t)\cdot(\Sigma hp_i(t)/\Sigma Hp(t))$ corresponds to a value obtained by multiplying the total electric energy consumption of a plurality of customers minus the discharge amount of the power storage (see the above formula for calculating Sp(t)) by the power unit price Su(t); and the first ratio $(\Sigma hp_i(t)/\Sigma Hp(t))$.

In Formula (8), $Pc\cdot(\Delta t/Pl)\cdot(\Sigma hp_i(t)/\Sigma Hp(t))$ corresponds to a value obtained by multiplying the power generator's introduction cost Pc by the third ratio showing a ratio of the first period Δt to the power generator's rated life Pl (Δt/Pl); and the above first ratio $(\Sigma hp_i(t)/\Sigma Hp(t))$.

As stated above, according to the present embodiment, when an appliance (particularly a power storage) is shared among a plurality of customers, the cost burden on each customer can be adjusted considering the usage level of each customer and deteriorating influence by each customer. Accordingly, it is possible to lay a fair cost burden on each customer.

Note that the appliance cooperation operation device can be realized by using a general computer device as basic hardware, for example. That is, each element included in the appliance cooperation operation device may be realized by letting a computer carry out a software (computer program) describing instructions of each process. In this case, the appliance cooperation operation can be realized by previously installing the computer program in the computer device or by properly installing, in the computer device, the computer program stored in a non-transitory computer readable medium such as hard disk, memory device, optical disk, etc. or distributed through the network. Further, the facility database and the electric energy database can be realized by properly using a storage medium such as internal/external memory or hard disk of the above computer device, CD-R, CD-RW, DVD-RAM, DVD-R, etc.

What is claimed is:

1. An appliance cooperation operation device, comprising:

a facility database configured to store an introduction cost of a power storage shared among a plurality of customers, and a rated life of the power storage;

a facility deteriorating influence calculator configured to calculate a deteriorating influence on the power storage by using at least one parameter selected from: a discharge rate of the power storage in a first period; depth of discharge at the end of the first period; and environmental temperature in the first period;

a customer electric energy collector configured to collect, from each of the customers, data of electric energy consumption in the first period; and a customer's burden cost calculator, including a processor, configured to calculate a burden cost of each customer in the first period to the introduction cost of the power storage, on which individual contribution by each customer to the deteriorating influence of the power storage is reflected, by multiplying: a first ratio of the electric energy consumption of each customer to a total electric energy consumption of the customers, the introduction cost of the power storage, a second ratio of the first period to the rated life, and the deteriorating influence.

2. The device of claim 1, further comprising an output unit configured to notify each customer of the burden cost calculated on each customer.

3. The device of claim 2, further comprising:

a power price collector configured to collect, from a server of a power company, data of a power unit price in the first period; and a power-storage electric energy collector configured to collect data of a discharge amount of the power storage in the first period, wherein the customer's burden cost calculator adds, to the burden cost of each customer, a value obtained by multiplying the total electric energy consumption of the customers minus the discharge amount of the power storage, by the power unit price and the first ratio, and the output unit notifies the customer of the burden cost after the addition.

4. The device of claim 3 further comprising:

a generated electric energy collector configured to collect data of a power generation amount of a power generator shared among the customers in the first period, wherein the facility database stores an introduction cost of the power generator, and a rated life of the power generator, and the customer's burden cost calculator further adds, to the burden cost of each customer, a value obtained by multiplying the introduction cost of the power generator, by a third ratio showing a ratio of the first period to the rated life of the power generator and the first ratio.

5. The device of claim 1, wherein the facility database stores at least one relational expression selected from: a relational expression between the discharge rate and a deterioration acceleration coefficient; a relational expression between the depth of discharge and the deterioration acceleration coefficient; and a relational expression between the environmental temperature and the deterioration acceleration coefficient, and the facility deteriorating influence calculator acquires a plurality of parameters, calculates deterioration acceleration coefficients correspondingly to the parameters respectively based on the facility database, and multiplies the deterioration acceleration coefficients to obtain the deteriorating influence.

6. The device of claim 1, wherein the first period is equivalent to each charge/discharge cycle in an operating period of the power storage.

7. The device of claim 1, wherein the facility deteriorating influence calculator calculates a deteriorating influence at each time in the first period by using at least one parameter selected from: a discharge rate of the power storage at each time in a first period; depth of discharge at each time in the first period; and environmental temperature at each time in the first period, and the customer's burden cost calculator calculates the burden cost of each customer in the first period by multiplying: the first ratio at each time, the introduction cost of the power storage, the second ratio, and the deteriorating influence at each time.

* * * * *